United States Patent
Rath et al.

(10) Patent No.: US 8,338,087 B2
(45) Date of Patent: *Dec. 25, 2012

(54) COMPOSITION AND PROCESS FOR POST-ETCH REMOVAL OF PHOTORESIST AND/OR SACRIFICIAL ANTI-REFLECTIVE MATERIAL DEPOSITED ON A SUBSTRATE

(75) Inventors: Melissa K. Rath, Danbury, CT (US); David D. Bernhard, Newtown, CT (US); David Minsek, New Milford, CT (US); Michael B. Korzenski, Danbury, CT (US); Thomas H. Baum, New Fairfield, CT (US)

(73) Assignee: Advanced Technology Materials, Inc, Danbury, CT (US)

( * ) Notice: Subject to any disclaimer, the term of this patent is extended or adjusted under 35 U.S.C. 154(b) by 816 days.

This patent is subject to a terminal disclaimer.

(21) Appl. No.: 10/792,038

(22) Filed: Mar. 3, 2004

(65) Prior Publication Data

US 2005/0197265 A1 Sep. 8, 2005

(51) Int. Cl.
*G03F 7/32* (2006.01)
*G03F 7/42* (2006.01)

(52) U.S. Cl. .......................................... 430/331; 134/2

(58) Field of Classification Search .................. 430/331, 430/256; 510/175, 176, 178; 134/2
See application file for complete search history.

(56) References Cited

U.S. PATENT DOCUMENTS

| | | | |
|---|---|---|---|
| 3,980,587 A | 9/1976 | Sullivan | |
| 4,776,892 A | 10/1988 | Steppan et al. | |
| 4,964,919 A | 10/1990 | Payne | |
| 5,139,607 A * | 8/1992 | Ward et al. ........................ | 216/83 |
| 5,419,779 A | 5/1995 | Ward .............................. | 134/38 |
| 5,709,756 A | 1/1998 | Ward et al. ....................... | 134/1.3 |
| 5,849,467 A * | 12/1998 | Sato et al. ........................ | 430/327 |
| 5,908,968 A * | 6/1999 | Carati et al. ..................... | 585/734 |
| 6,110,881 A | 8/2000 | Lee ................................ | 510/175 |
| 6,117,795 A * | 9/2000 | Pasch ............................. | 438/745 |
| 6,200,947 B1 | 3/2001 | Takashima et al. | |
| 6,228,823 B1 | 5/2001 | Morinaga et al. | |
| 6,242,400 B1 | 6/2001 | Lee ................................ | 510/176 |
| 6,276,372 B1 | 8/2001 | Lee ................................ | 134/1.3 |
| 6,329,118 B1 | 12/2001 | Hussein et al. ............... | 430/270.1 |
| 6,367,486 B1 | 4/2002 | Lee et al. | |
| 6,372,050 B2 | 4/2002 | Honda et al. | |
| 6,383,939 B1 | 5/2002 | Yang et al. | |
| 6,440,647 B1 | 8/2002 | Yakobson | |
| 6,472,357 B2 | 10/2002 | Takashima | |
| 6,551,973 B1 * | 4/2003 | Moore .......................... | 510/176 |
| 6,572,743 B2 * | 6/2003 | Miller et al. ............. | 204/297.06 |
| 6,599,370 B2 * | 7/2003 | Skee .................................. | 134/3 |
| 6,797,682 B2 | 9/2004 | Hara et al. | |
| 7,309,559 B2 * | 12/2007 | Natori et al. ............... | 430/270.1 |
| 2001/0021488 A1 * | 9/2001 | Ichiki ............................. | 430/329 |
| 2002/0128164 A1 | 9/2002 | Hara et al. ..................... | 510/175 |
| 2003/0004085 A1 | 1/2003 | Ando et al. | |
| 2003/0130147 A1 * | 7/2003 | Koito et al. .................... | 510/175 |
| 2004/0029051 A1 * | 2/2004 | Koita et al. .................... | 430/313 |
| 2004/0134682 A1 * | 7/2004 | En et al. ........................ | 174/258 |
| 2004/0180300 A1 * | 9/2004 | Minsek et al. ................ | 430/329 |
| 2004/0220065 A1 | 11/2004 | Hsu | |
| 2004/0259761 A1 * | 12/2004 | Yokoi et al. ................... | 510/504 |
| 2005/0106492 A1 * | 5/2005 | Yokoi et al. ................... | 430/256 |
| 2005/0176603 A1 * | 8/2005 | Hsu ................................ | 510/175 |
| 2007/0003859 A1 * | 1/2007 | Yokoi et al. ................... | 430/256 |

FOREIGN PATENT DOCUMENTS

| | | |
|---|---|---|
| JP | 03044600 A | 2/1991 |
| JP | 2002062668 A | 2/2002 |

OTHER PUBLICATIONS

U.S. Appl. No. 60/479,146, filed Jun. 2003, Yokoi et al.*
Ito, Dissolution Behavior of Chemically Amplified Resist Polymers for 248, 193—and 157—nm Lithography, IBM J. Res. $ Dev., vol. 45 No. 5, (Sep. 2001).
M. Hussein, et al. "A Novel Approach to Dual Damascene Patterning", Intel Corporation, Portland Technology Development, Hillsboro, OR.
U.S. Appl. No. 10/389,214, filed Mar. 14, 2003, Minsek, et al.
U.S. Appl. No. 60/386,800, filed Jun. 7, 2002, Hsu, Chien-Pin Sherman.

* cited by examiner

*Primary Examiner* — Hoa V Le

(74) *Attorney, Agent, or Firm* — Tristan A. Fuierer; Moore & Van Allen, PLLC; Rosa Yaghmour

(57) ABSTRACT

A composition and process for removing photoresist and/or sacrificial anti-reflective coating (SARC) materials from a substrate having such material(s) thereon. The composition includes a base component, such as a quaternary ammonium base in combination with an alkali or alkaline earth base, or alternatively a strong base in combination with an oxidant. The composition may be utilized in aqueous medium, e.g., with chelator, surfactant, and/or co-solvent species, to achieve high-efficiency removal of photoresist and/or SARC materials in the manufacture of integrated circuitry, without adverse effect on metal species on the substrate, such as copper, aluminum and/or cobalt alloys, and without damage to SiOC-based dielectric materials employed in the semiconductor architecture.

41 Claims, No Drawings

COMPOSITION AND PROCESS FOR POST-ETCH REMOVAL OF PHOTORESIST AND/OR SACRIFICIAL ANTI-REFLECTIVE MATERIAL DEPOSITED ON A SUBSTRATE

BACKGROUND OF THE INVENTION

1. Field of the Invention

The present invention relates to a composition and process useful for removal of post-etch photoresist and/or sacrificial anti-reflective coating material from a substrate or article having such material deposited thereon.

2. Description of the Related Art

Semiconductor integration as currently evolving requires (i) use of antireflective coatings, (ii) minimization of etch/ash-induced damage to low k dielectric material, (iii) minimization of effective k values for dielectric/etch stop interconnect layers and (iv) wide process latitude in terms of permissible conditions and variation of integration techniques.

The foregoing requirements can be accommodated by use of etching operations without ashing, using a dielectric patterning process that employs a sacrificial antireflective coating, in combination with a liquid cleaning chemistry that removes the post-etch photoresist and SARC in a single process step.

Current photolithography processes used in semiconductor manufacturing require use of a UV/light-absorbing coating below the photoresist layer to prevent reflection of the stepper UV light. Without this coating, significant amounts of light are reflected off the underlying substrate. Such reflected light, in turn, can create defects during the photolithographic process, such as photoresist notching resulting from constructive and destructive interference, non-uniform photospeed, occurrence of gross photolithographic pattern defects, loss of critical dimensioning capability, and the like.

Several approaches exist for attaining high absorbance of UV light in photolithographic processes, including use of bi- and tri-layer photoresists, use of bottom antireflective coatings (BARCs) and sacrificial antireflective coatings (SARCs). All of these approaches incorporate a UV chromophore into a spin-on polymer matrix that absorbs incident light. All of these antireflective coatings also have a planarizing effect on topological wafer surfaces encountered in typical dual damascene integration.

When SiOC-based dielectric materials are employed in the semiconductor integration, however, the use of SARCs has two important advantages over the other approaches mentioned above.

First, since SARC materials are based on tetraethylorthosilicate (TEOS), they are etchable in a similar manner and at similar rate to SiOC-based dielectric material. This allows a very high level of etch uniformity and etch control to be achieved, to such extent that trench etch stop layers are not required, and via etch stop layers can be reduced in thickness by up to 50%, in relation to the aforementioned alternative approaches.

Second, etched SARCs can be removed by liquid cleaner/etchant compositions, since etched SARCs do not significantly increase their degree of cross-linking after etch, in relation to organic-based photoresists and BARCs.

When a cleaner/etchant composition is used in back-end-of-line (BEOL) applications to process aluminum or copper interconnected wires, separated by low capacitance (low k) insulating material, or dielectric, it is important that the composition used to remove photoresist residue and SARCs possess good metal compatibility, e.g., a low etch rate on copper, aluminum, cobalt, etc.

Untreated photoresist possesses solubility in strong aqueous alkaline solutions as well as solutions of select organic solvents. However, photoresist that has been exposed to gas-phase plasma etching, such is typically used for etching of dielectric materials, will develop a hardened crust on the surface of the material. The hardened crust is composed of cross-linked organic polymer and may contain small amounts of silicon or metal atoms. Fluorine-based plasma etches as used in dual damascene processes may deposit fluorine atoms in the photoresist crust, which may decrease its solubility and increase its resistance to chemical removal.

The photoresist and crust can be removed by gas phase ashing where the substrate is exposed to an oxidative or reductive plasma etch, but these plasma ashing techniques can cause damage to the dielectric, especially porous, organosilicate or organic low k materials, causing an unacceptable increase in k value. The semiconductor features of the structure being fabricated may contain metals vital to the operation of the eventual product chip, such as copper, aluminum and alloys of cobalt.

Hydroxylamine solutions have been utilized in the art for photoresist removal, but such solutions have associated corrosion, toxicity and reactivity problems that limit their use, with adverse corrosion effects being particularly problematic when copper is employed in the integrated circuitry.

SUMMARY OF THE INVENTION

The present invention in one aspect relates to a cleaning composition useful for removing photoresist and/or sacrificial anti-reflective coating (SARC) materials from a substrate having such material(s) thereon. The composition includes an active cleaning combination (ACC) selected from the group consisting of: (a) a quaternary ammonium base in combination with at least one of alkali and alkaline earth base; and (b) a strong base in combination with an oxidant.

Another aspect of the invention relates to a method of removing photoresist and/or SARC material from a substrate having said material thereon, said method comprising contacting the substrate with a cleaning composition for sufficient time to at least partially remove said material from the substrate, wherein the cleaning composition includes an active cleaning combination (ACC) selected from the group consisting of: (a) a quaternary ammonium base in combination with at least one of alkali and alkaline earth base; and (b) a strong base in combination with an oxidant.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention contemplates cleaning compositions that are useful to remove photoresist and/or sacrificial anti-reflective coating (SARC) materials from a substrate having such material(s) thereon.

The composition includes an active cleaning combination (ACC) selected from the group consisting of: (a) a quaternary ammonium base in combination with at least one of alkali and alkaline earth base; and (b) a strong base in combination with an oxidant.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.01 weight percent, based on the total weight of the composition in which such components are employed.

The present invention in one aspect thereof relates to a cleaning composition useful for removal of SARCs and photoresist, which includes the following components:
0.1-40.0 weight % organic quaternary ammonium base
0.01-5 weight % alkali or alkaline earth base
0-80 weight % solvent(s) and/or amine(s)
0-5 weight % surfactant
0-10 weight % chelator/passivation agent
0-98 weight % water
wherein percentages of the components are percentages by weight, based on total weight of the composition, and wherein the total of the weight percentages of such components of the composition does not exceed 100 weight %.

Such composition may optionally include additional components, including active as well as inactive ingredients, e.g., stabilizers, dispersants, anti-oxidants, penetration agents, adjuvants, additives, fillers, excipients, etc.

In various embodiments, the composition may variously comprise, consist of, or consist essentially of, the aforementioned organic quaternary ammonium base, alkali or alkaline earth base, solvent(s) and/or amine(s), surfactant, chelator/passivation agent, and water components.

In one specific embodiment, the cleaning composition includes the following components:
2-15 weight % organic quaternary ammonium base
~0.01-2 weight % alkali or alkaline earth base
0-50 weight % solvent(s) and/or amine(s)
~0.01-2 weight % surfactant
0-5 weight % chelator/passivation agent
40-95 weight % water
wherein percentages of the components are percentages by weight, based on total weight of the composition, and wherein the total of the weight percentages of such components of the composition does not exceed 100 weight %.

In various preferred embodiments, the cleaning composition is formulated in the following Formulations A-G, wherein all percentages are by weight, based on the total weight of the formulation:

| Formulation A | |
|---|---|
| 5.36% | benzyltrimethylammonium hydroxide |
| 0.28% | potassium hydroxide |
| 3.0% | 4-methylmorpholine N-oxide |
| 0.30% | polyoxyethylene(150) dinonylphenyl ether |
| 0.08% | 2-mercaptobenzimidazole |
| 91.0% | water |

| Formulation B | |
|---|---|
| 5.36% | benzyltrimethylammonium hydroxide |
| 0.28% | potassium hydroxide |
| 3.0% | 4-methylmorpholine N-oxide |
| 0.30% | polyoxyethylene(150) dinonylphenyl ether |
| 0.20% | 5-amino-1,3,4-thiadiazole-2-thiol |
| 90.86% | water |

| Formulation C | |
|---|---|
| 3.60% | benzyltrimethylammonium hydroxide |
| 0.27% | potassium hydroxide |
| 3.5% | 4-methylmorpholine N-oxide |
| 15.0% | 4-(3-aminopropyl)morpholine |
| 0.30% | polyoxyethylene(150) dinonylphenyl ether |
| 0.08% | 2-mercaptobenzimidazole |
| 77.25% | water |

| Formulation D | |
|---|---|
| 5.36% | benzyltrimethylammonium hydroxide |
| 0.28% | potassium hydroxide |
| 20.0% | dimethyl sulfoxide |
| 0.08% | 2-mercaptobenzimidazole |
| 74.28% | water |

| Formulation E | |
|---|---|
| 5.36% | benzyltrimethylammonium hydroxide |
| 0.28% | potassium hydroxide |
| 10.0% | tetramethylene sulfone |
| 0.30% | oxirane, methyl-, polymer with oxirane, ether with 2.2'-(oxidoimino)bis(ethanol) (2:1), N(-3(C(-11-isoalkyloxy)propyl)derivatives, $C_{10}$-rich |
| 0.08% | 2-mercaptobenzimidazole |
| 83.98% | water |

| Formulation F | |
|---|---|
| 5.36% | benzyltrimethylammonium hydroxide |
| 0.28% | potassium hydroxide |
| 10.0% | di(ethyleneglycol)butyl ether |
| 10.0% | 2-(2-dimethylamino)ethoxy)ethanol |
| 0.30% | oxirane, methyl-, polymer with oxirane, ether with 2.2'-(oxidoimino)bis(ethanol) (2:1), N(-3(C(-11-isoalkyloxy)propyl)derivatives, $C_{10}$-rich |
| 74.06% | water |

| Formulation G | |
|---|---|
| 5.36% | benzyltrimethylammonium hydroxide |
| 0.28% | potassium hydroxide |
| 10.0% | tetramethylene sulfone |
| 10.0% | di(ethyleneglycol)butyl ether |
| 0.10% | oxirane, methyl-, polymer with oxirane, mono(octylphenyl)ether |
| 0.08% | 2-mercaptobenzimidazole |
| 74.18% | water |

In another aspect, the present invention relates to a cleaning composition that is useful for stripping photoresist and/or photoresist residues from semiconductor substrates and/or SARCs while maintaining cobalt and copper compatibility. Such cleaning composition includes an aqueous solution of at least one oxidant, a strong base, optionally a chelator and optionally a co-solvent and/or a surfactant. The cleaning composition effectively removes photoresist from the top of the semiconductor device without causing damage to the dielectric material and without causing corrosion of the underlying metal.

Compositions of such type in which the base component includes potassium hydroxide are especially advantageous in achieving high efficiency cleaning without adverse effect on the dielectric layer.

Compositions of such type, in one embodiment, include the following components by weight, based on the total weight of the composition:

0.1-30 wt % strong base
0.01-30 wt % oxidant
0-10 wt % chelator
0-5 wt % surfactant
0-50 wt % co-solvent
20-98.9 wt % deionized water As used in such context, the term "strong base" means a cation/anion salt that dissociates in aqueous or partially aqueous solutions to yield virtually stoichiometric amounts of hydroxide anions. The strong base can include bases such as potassium hydroxide and alkylammonium hydroxides such as tetramethylammonium hydroxide (TMAH), choline hydroxide, benzyltrimethylammonium hydroxide, etc.

In one embodiment, the compositions of the invention are devoid of hydroxylamine.

The oxidant in such composition can include, without limitation, inorganic and/or organic oxidizers, such as hydrogen peroxide, organic peroxides, amine-N-oxides, perborate salts, persulfate salts, as well as combinations of two or more of the foregoing.

The chelator in such composition can be of any suitable type, and may include, without limitation, triazoles, such as 1,2,4-triazole, or triazoles substituted with substituents such as C1-C8 alkyl, amino, thiol, mercapto, imino, carboxy and nitro groups, such as benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like, as well as thiazoles, tetrazoles, imidazoles, phosphates, thiols and azines such as 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3,4-thiadiazole-2-thiol, benzothiazole, tritolyl phosphate, indiazole, etc. Suitable chelator species further include glycerols, amino acids, carboxylic acids, alcohols, amides and quinolines such as guanine, adenine, glycerol, thioglycerol, nitrilotriacetic acid, salicylamide, iminodiacetic acid, benzoguanamine, melamine, thiocyranuric acid, anthranilic acid, gallic acid; ascorbic acid; salicylic acid; 8-hydroxyquinoline, 5-carboxylic acid-benzotriazole, 3-mercaptopropanol, boric acid, iminodiacetic acid, etc. The chelator is usefully employed to increase the compatibility of the composition with the metals and the dielectric materials used in the semiconductor device.

The surfactant employed in the composition can be of any suitable type, e.g., nonionic surfactants such as fluoroalkyl surfactants, polyethylene glycols, polypropylene glycols, polyethylene or polypropylene glycol ethers, carboxylic acid salts, dodecylbenzenesulfonic acid or salts thereof, polyacrylate polymers, dinonylphenyl polyoxyethylene, or other substituted phenyl polyoxyethylenes, silicone or modified silicone polymers, acetylenic diols or modified acetylenic diols, alkylammonium or modified alkylammonium salts, as well as combinations of two or more of the foregoing.

Suitable co-solvent species for such composition include, without limitation, amines such as dimethyldiglycolamine, 1,8-diazabicyclo[5.4.0]undecene, aminopropylmorpholine, triethanolamine, methylethanolamine, methyldiethanolamine, etc. or glycols such as ethylene or polyethylene, propylene glycol, neopentyl glycol, etc., amines such as hydroxyethylmorpholine, aminopropylmorpholine, etc. or glycol ethers such as di(ethylene glycol)monoethyl ether, di(propylene glycol)propyl ether, ethylene glycol phenyl ether, di(propylene glycol) butyl ether, butyl carbitol, etc., or polyglycol ethers.

Specific embodiments of such composition are set out as Formulations H-S below, wherein all percentages are by weight, based on the total weight of the composition.

| Formulation H | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 3-amino-5-mercapto-1,2,4-triazole | 0.1% |
| water | 73.9% |

| Formulation I | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| ammonium tetrathiomolybdate | 0.1% |
| water | 73.9% |

| Formulation J | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |
| aminopropylmorpholine | 20.0% |
| water | 53.9% |

| Formulation K | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |

| Formulation K | |
|---|---|
| N-ethylmorpholine | 20.0% |
| water | 53.9% |

| Formulation L | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |
| aminoethylpiperidine | 20.0% |
| water | 53.9% |

| Formulation M | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 3-amino-5-1,2,4-triazole | 0.1% |
| aminopropylmorpholine | 20.0% |
| water | 53.9% |

| Formulation N | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 3-amino-5-1,2,4-triazole | 0.1% |
| aminopropylmorpholine | 10.0% |
| water | 63.9% |

| Formulation O | |
|---|---|
| tetramethylammonium hydroxide, 25% aqueous solution | 14.7% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |
| aminopropylmorpholine | 20.0% |
| water | 53.9% |

| Formulation P | |
|---|---|
| tetramethylammonium hydroxide, 25% aqueous solution | 14.7% |
| N-methylmorpholine oxide, 50% aqueous solution | 7.0% |
| dinonylphenol polyoxyethylene 7% aqueous solution | 4.3% |
| 2-mercaptobenzimidazole | 0.1% |
| aminopropylmorpholine | 10.0% |
| water | 63.9% |

| Formulation Q | |
|---|---|
| benzyltrimethylammonium hydroxide, 40% aqueous solution | 9.0% |
| potassium hydroxide, 45% aqueous solution | 0.6% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |
| aminopropylmorpholine | 20.0% |
| water | 59.02% |

| Formulation R | |
|---|---|
| benzyltrimethylammonium hydroxide, 40% aqueous solution | 9.0% |
| potassium hydroxide, 45% aqueous solution | 0.6% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |
| aminopropylmorpholine | 15.0% |
| water | 64.02% |

| Formulation S | |
|---|---|
| benzyltrimethylammonium hydroxide, 40% aqueous solution | 9.0% |
| potassium hydroxide, 45% aqueous solution | 0.6% |
| N-methylmorpholine oxide, 50% aqueous solution | 7.0% |
| dinonylphenol polyoxyethylene, 7% aqueous solution | 4.3% |
| 2-mercaptobenzimidazole | 0.1% |
| aminopropylmorpholine | 10.0% |
| water | 69.02% |

In another aspect, the invention contemplates cleaning compositions that include the following components by weight, based on the total weight of the composition:

0.1-30 wt % strong base
2-30 wt % oxidant
0-10 wt % chelator
0-5 wt % surfactant
0-50 wt % co-solvent
20-98 wt % deionized water The strong base, oxidant, chelator, co-solvent and surfactant species in such composition may be of same or corresponding species to those discussed illustratively hereinabove.

Specific embodiments of such composition are set out as Formulations T, U, V, W, X, Y, Z, $A^2$, $B^2$, $C^2$, $D^2$, $E^2$, $F^2$, $G^2$, $H^2$, $I^2$, $J^2$, $K^2$ and $L^2$ below, wherein all percentages are by weight, based on the total weight of the composition.

| Formulation T | |
|---|---|
| benzyltrimethylammonium hydroxide, 40% aqueous solution | 13.4% |
| N-methylmorpholine oxide, 50% aqueous solution | 7.0% |
| Potassium hydroxide, 45% aqueous solution | 0.6% |
| 2-mercaptobenzimidazole | 0.08% |
| dinonylphenol polyoxyethylene | 0.3% |
| water | 78.62% |

| Formulation U | |
|---|---|
| benzyltrimethylammonium hydroxide, 40% aqueous solution | 13.4% |
| N-methylmorpholine oxide, 50% aqueous solution | 7.0% |

| Formulation U | |
|---|---|
| Potassium hydroxide, 45% aqueous solution | 1.2% |
| 2-mercaptobenzimidazole | 0.08% |
| dinonylphenol polyoxyethylene | 0.3% |
| water | 78.02% |

| Formulation V | |
|---|---|
| tetramethylammonium hydroxide, 25% aqueous solution | 5.85% |
| N-methylmorpholine oxide, 50% aqueous solution | 7.0% |
| Potassium hydroxide, 45% aqueous solution | 1.2% |
| 2-mercaptobenzimidazole | 0.08% |
| dinonylphenol polyoxyethylene | 0.3% |
| water | 85.57% |

| Formulation W | |
|---|---|
| tetramethylammonium hydroxide, 25% aqueous solution | 2.93% |
| N-methylmorpholine oxide, 50% aqueous solution | 7.0% |
| Potassium hydroxide, 45% aqueous solution | 1.2% |
| 2-mercaptobenzimidazole | 0.08% |
| dinonylphenol polyoxyethylene | 0.3% |
| water | 88.49% |

| Formulation X | |
|---|---|
| benzyltrimethylammonium hydroxide, 40% aqueous solution | 7.2% |
| N-methylmorpholine oxide, 50% aqueous solution | 7.0% |
| Potassium hydroxide, 45% aqueous solution | 0.6% |
| 2-mercaptobenzimidazole | 0.08% |
| dinonylphenol polyoxyethylene | 0.3% |
| water | 84.82% |

| Formulation Y | |
|---|---|
| benzyltrimethylammonium hydroxide, 40% aqueous solution | 3.6% |
| N-methylmorpholine oxide, 50% aqueous solution | 7.0% |
| Potassium hydroxide, 45% aqueous solution | 1.2% |
| 2-mercaptobenzimidazole | 0.08% |
| dinonylphenol polyoxyethylene | 0.3% |
| water | 87.82% |

| Formulation Z | |
|---|---|
| benzyltrimethylammonium hydroxide, 40% aqueous solution | 3.6% |
| N-methylmorpholine oxide, 50% aqueous solution | 7.0% |
| Potassium hydroxide, 45% aqueous solution | 0.6% |
| 2-mercaptobenzimidazole | 0.08% |
| dinonylphenol polyoxyethylene | 0.3% |
| water | 88.42% |

| Formulation A$^2$ | |
|---|---|
| benzyltrimethylammonium hydroxide, 40% aqueous solution | 7.2% |
| N-methylmorpholine oxide, 50% aqueous solution | 7.0% |
| Potassium hydroxide, 45% aqueous solution | 0.3% |
| 2-mercaptobenzimidazole | 0.08% |
| dinonylphenol polyoxyethylene | 0.3% |
| water | 85.12% |

| Formulation B$^2$ | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 3-amino-5-mercapto-1,2,4-triazole | 1.0% |
| water | 72.04% |

| Formulation C$^2$ | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 4-methyl-2-phenyl-imidazole | 1.0% |
| water | 72.04% |

| Formulation D$^2$ | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 2-mercaptothiazoline | 1.0% |
| water | 72.04% |

| Formulation E$^2$ | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 8-hydroxyquinoline | 1.0% |
| water | 72.04% |

| Formulation F$^2$ | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 1-phenyl-2-tetrazoline-5-thione | 1.0% |
| water | 72.04% |

| Formulation G² | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| gallic acid | 1.0% |
| water | 72.04% |

| Formulation H² | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| salicylic acid | 1.0% |
| water | 72.04% |

| Formulation I² | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| ascorbic acid | 1.0% |
| water | 72.04% |

| Formulation J² | |
|---|---|
| benzyltrimethylammonium hydroxide, 40% aqueous solution | 7.2% |
| Potassium hydroxide, 45% aqueous solution | 0.6% |
| 2-mercaptobenzimidazole | 0.08% |
| aminopropyl morpholine | 10% |
| 4-methyl-2-phenyl-imidazole | 1.0% |
| water | 81.12% |

| Formulation K² | |
|---|---|
| benzyltrimethylammonium hydroxide, 40% aqueous solution | 7.2% |
| Potassium hydroxide, 45% aqueous solution | 0.6% |
| 2-mercaptobenzimidazole | 0.08% |
| aminopropyl morpholine | 10% |
| 4-methyl-2-phenyl-imidazole | 0.5% |
| water | 81.62% |

| Formulation L² | |
|---|---|
| benzyltrimethylammonium hydroxide, 40% aqueous solution | 7.2% |
| Potassium hydroxide, 45% aqueous solution | 0.6% |
| 2-mercaptobenzimidazole | 0.08% |
| aminopropyl morpholine | 10% |
| 4-methyl-2-phenyl-imidazole | 1.0% |
| water | 81.02% |
| dinonylphenol polyoxyethylene | 0.1% |

Still other formulations within the broad scope of the present invention, which are suitable for stripping photoresist and/or photoresist residues from semiconductor substrates, while maintaining cobalt and copper compatibility, include the formulations M², N², O², P², Q² and R² whose compositions are set out below.

| Formulation M² | |
|---|---|
| tetramethylammonium hydroxide, 25% aqueous solution | 4.0% |
| hydrogen peroxide, 30% aqueous solution | 2.0% |
| 5-aminotetrazole | 0.1% |
| water | 93.9% |

| Formulation N² | |
|---|---|
| tetramethylammonium hydroxide, 25% aqueous solution | 4.0% |
| hydrogen peroxide, 30% aqueous solution | 2.0% |
| 2,4-diamino-6-methyl-1,3,5-triazine | 0.1% |
| water | 93.9% |

| Formulation O² | |
|---|---|
| tetramethylammonium hydroxide, 25% aqueous solution | 4.0% |
| hydrogen peroxide, 30% aqueous solution | 2.0% |
| 5-amino-1,3,4-thiadiazole-2-thiol | 0.1% |
| water | 93.9% |

| Formulation P² | |
|---|---|
| tetramethylammonium hydroxide, 25% aqueous solution | 4.0% |
| hydrogen peroxide, 30% aqueous solution | 2.0% |
| 1,2,4-triazole | 0.1% |
| water | 93.9% |

| Formulation Q² | |
|---|---|
| tetramethylammonium hydroxide, 25% aqueous solution | 4.0% |
| hydrogen peroxide, 30% aqueous solution | 2.0% |
| 2,4-dihydroxy-6-methylpyrimidine | 0.1% |
| water | 93.9% |

| Formulation R² | |
|---|---|
| tetramethylammonium hydroxide, 25% aqueous solution | 4.0% |
| hydrogen peroxide, 30% aqueous solution | 2.0% |
| 8-hydroxyquinoline | 0.1% |
| water | 93.9% |

The cleaning compositions of the invention are easily formulated by simple addition of the respective ingredients and mixing to homogeneous condition.

In cleaning application, the cleaning composition is applied in any suitable manner to the material to be cleaned, e.g., by spraying the cleaning composition on the surface of the material to be cleaned, by dipping (in a volume of the cleaning composition) of the material or article including the material to be cleaned, by contacting the material or article to be cleaned with another material, e.g., a pad, or fibrous sorbent applicator element, that is saturated with the cleaning composition, or by any other suitable means, manner or technique, by which the cleaning composition is brought into cleaning contact with material to be cleaned.

As applied to semiconductor manufacturing operations, the cleaning compositions of the present invention are usefully employed to remove photoresist and/or SARC materials from substrates and semiconductor device structures on which such material(s) have been deposited.

The compositions of the present invention, by virtue of their selectivity for such photoresist and/or SARC materials, relative to other materials that may be present on the semiconductor substrate and exposed to the cleaning composition, such as ILD structures, metallization, barrier layers, etc., achieve removal of the photoresist and/or SARC material(s) in a highly efficient manner.

In use of the compositions of the invention for removing photoresist and/or SARC materials from semiconductor substrates having same thereon, the cleaning composition typically is contacted with the substrate for a time of from about 10 to about 45 minutes, at temperature in a range of from about 50° C. to about 80° C. Such contacting times and temperatures are illustrative, and any other suitable time and temperature conditions may be employed that are efficacious to at least partially remove the photoresist and/or SARC material from the substrate, within the broad practice of the invention.

Following the achievement of the desired cleaning action, the cleaning composition is readily removed from the substrate or article to which it has previously been applied, e.g., by rinse, wash, or other removal step(s), as may be desired and efficacious in a given end use application of the compositions of the present invention.

The features and advantages of the invention are more fully illustrated by the following non-limiting examples, wherein all parts and percentages are by weight, unless otherwise expressly stated.

EXAMPLE 1

Samples of Formulations A, B, C, D, E, F and G, having the respective compositions described hereinabove, were prepared.

The efficacy of these formulations for removing photoresist and SARC from a substrate containing same coated thereon, while maintaining a low etching action on copper metallization on such substrate, was evaluated in corresponding tests in which the cleaning composition of the particular formulation was contacted with the substrate for 6-15 minutes at 60-70° C. followed by rinsing of the substrate with deionized water. The substrate was a post-etch structure on a silicon wafer containing patterned organosilicate dielectric and SARC structures underneath patterned photoresist. The photoresist was a standard commercially available chemically amplified resist for 193 or 248 nm lithography. The SARC material was consisted of a commercially available spin-on polysiloxane material layer incorporating a dye material that strongly absorbs light at the frequency used for lithography.

Following such contacting and rinse steps, the percentage removal of photoresist, the percentage removal of SARC, and the copper etch rate, in Angstroms per minute (Å/min), were determined. The corresponding data are set out in Table 1 below.

TABLE 1

Percentage Photoresist Removal, Percentage SARC Removal and Cu Etch Rate (Å/min) of Formulations A-G

| Formulation | Photoresist Removal, % | SARC Removal, % | Cu Etch Rate (Å/min) |
|---|---|---|---|
| A | 100 | 100 | 0.77 |
| B | 100 | 100 | 1.3 |
| C | 100 | 100 | 2.5 |
| D | 99 | 100 | — |
| E | 99 | 100 | 0.42 |
| F | 85 | 100 | 1.3 |
| G | 100 | 100 | 0.70 |

EXAMPLE 2

Samples of Formulations H, I, J, K, L, M, N, O, P, Q, R and S, having the respective compositions described hereinabove, were prepared.

The efficacy of these formulations for removing photoresist residues from a semiconductor substrate having photoresist, copper and cobalt metal thereon, while maintaining a low etching action on the copper and cobalt on such substrate, was evaluated in corresponding tests in which the cleaning composition of the particular formulation was contacted with the substrate at 60-70° C. following by rinsing of the substrate with deionized water. The substrate was a post-etch structure on a silicon wafer containing patterned organosilicate dielectric and SARC structures underneath patterned photoresist. The photoresist was a standard commercially available chemically amplified resist for 193 or 248 nm lithography. Substantial cleaning is defined as greater than 80% removal of the photoresist from the semiconductor device, as determined by optical microscopy.

Data are set out in Table 2 below.

TABLE 2

Cleaning Performance of Formulations H-S

| Formulation | Temperature, ° C. | Contact Time, Min. | Cobalt Compatibility | Copper Compatibility | % Cleaning of Photoresist |
|---|---|---|---|---|---|
| H | 70 | 30 | slight roughening of surface | etch rate of 0.62 Å/min | 100 |
| I | 70 | 20 | slight roughening of surface | incompatible | 100 |
| J | 70 | 30 | good | good | 100 |
| K | 70 | 30 | some surface deposition, no thickness change | good | 100 |
| L | 70 | 30 | good | good | 100 |
| M | 70 | 30 | good | good | 100 |
| N | 70 | 30 | good | good | 100 |
| O | 70 | 30 | good | good | 100 |
| P | 70 | 30 | good | good | 100 |
| Q | 60 | 30 | good | good | 100 |
| R | 60 | 30 | good | good | 100 |
| S | 60 | 30 | good | good | 100 |

EXAMPLE 3

Samples of Formulations T, U, V, W, X, Y, Z, $A^2$, $B^2$, $C^2$, $D^2$, $E^2$, $F^2$, $G^2$, $H^2$, $I^2$, $J^2$, $K^2$ and $L^2$, having the respective compositions described hereinabove, were prepared.

The efficacy of these formulations, for removing photoresist residues from a semiconductor substrate having photoresist thereon, was evaluated in corresponding tests in which the cleaning composition of the particular formulation was contacted with the substrate for 12 minutes at 70° C. following by rinsing of the substrate with deionized water. The substrate was a post-etch structure on a silicon wafer containing patterned organosilicate dielectric and SARC structures underneath patterned photoresist. The photoresist was a standard commercially available chemically amplified resist for 193 or 248 nm lithography. Substantial cleaning is defined as greater than 80% removal of the photoresist from the semiconductor device, as determined by optical microscopy.

Results are set out in Table 3 below.

TABLE 3

Percentage Photoresist Removal of Formulations T-$A^2$

| Formulation | Percentage Removal of Photoresist From Substrate |
|---|---|
| T | 100 |
| U | 100 |
| V | 100 |
| W | 100 |
| X | 100 |
| Y | 95 |
| Z | 95 |
| $A^2$ | 100 |

TABLE 5

Cleaning Performance of Formulations $B^2$-$L^2$

| Formulation | Temperature ° C. | Contact Time, Min. | Cobalt Compatibility | % Cleaning of Photoresist |
|---|---|---|---|---|
| $B^2$ | 60 | 60 | good | 100 |
| $C^2$ | 60 | 60 | good | 100 |
| $D^2$ | 60 | 60 | good | 100 |
| $E^2$ | 60 | 60 | good | 100 |
| $F^2$ | 60 | 60 | good | 100 |
| $G^2$ | 60 | 60 | good | 100 |
| $H^2$ | 60 | 60 | good | 100 |
| $I^2$ | 60 | 60 | good | 100 |
| $J^2$ | 60 | 60 | decent | 100 |
| $K^2$ | 60 | 60 | decent | 100 |
| $L^2$ | 60 | 60 | decent | 100 |

EXAMPLE 4

Samples of Formulations $M^2$, $N^2$, $O^2$, $P^2$, $Q^2$ and $R^2$, having the respective compositions described hereinabove, were prepared.

The efficacy of these formulations for removing photoresist residues from a semiconductor substrate having photoresist, copper and cobalt metal thereon, while maintaining a low etching action on the copper and cobalt on such substrate, was evaluated in corresponding tests in which the cleaning composition of the particular formulation was contacted with the substrate at 70° C. followed by rinsing of the substrate with deionized water. The substrate was a post-etch structure on a silicon wafer containing patterned organosilicate dielectric and SARC structures underneath patterned photoresist. The photoresist was a standard commercially available chemically amplified resist for 193 or 248 nm lithography. Substantial cleaning is defined as greater than 80% removal of the photoresist from the semiconductor device, as determined by optical microscopy.

Data are set out in Table 5 below.

TABLE 5

Cleaning Performance of Formulations $M^2$-$R^2$

| Formulation | Temperature ° C. | Contact Time, Min. | Cobalt Compatibility | Cobalt Etch Rate, Å/min | Copper Etch Rate, Å/min | % Cleaning of Photoresist |
|---|---|---|---|---|---|---|
| $M^2$ | 70 | 30 | good | 0.048 | 0.84 | 100 |
| $N^2$ | 70 | 30 | good | 0.16 | 0.52 | 100 |
| $O^2$ | 70 | 30 | good | 0.21 | 0.72 | 100 |
| $P^2$ | 70 | 30 | good | — | incompatible | 100 |
| $Q^2$ | 70 | 30 | good | — | 2.55 | 100 |
| $R^2$ | 70 | 30 | good | — | incompatible | 100 |

The foregoing examples demonstrate that the cleaning compositions of the invention are useful for removal of photoresist and/or SARCs from semiconductor substrates having same coated thereon. Further, such compositions can be employed without adverse effect on metallization on the substrate, e.g., copper, aluminum and cobalt alloys.

Further, the cleaning compositions of the invention are readily formulated with suitable solvent systems, e.g., aqueous and semi-aqueous solvent systems, conferring low toxicity and low combustibility characteristics to such compositions.

Accordingly, the cleaning compositions of the present invention achieve a substantial advance in the art of removing photoresist and/or SARC materials, in the manufacture of integrated circuit devices.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A cleaning composition comprising a quaternary base, at least one alkali or alkaline earth base, and at least one additional component selected from the group consisting of a chelator, an oxirane species, and combinations thereof, wherein said chelator comprises a species selected from the group consisting of: 1-amino-1,2,4-triazole; 1-amino-1,2,3-triazole; 1-amino-5-methyl-1,2,3-triazole; 3-mercapto-1,2,4-triazole; 3-isopropyl-1,2,4-triazole; naphthotriazole; 2-mercaptobenzimidazole; 5-aminotetrazole; 5-amino-1,3,4-thiadiazole-2-thiol; 2,4-diamino-6-methyl-1,3,5-triazine; triazine; methyltetrazole; 1,5-pentamethylenetetrazole; 1-phenyl-5-mercaptotetrazole; diaminomethyltriazine; imidazoline thione; 4-methyl-4H-1,2,4-triazole-3-thiol; 5-amino-1,3,4-thiadiazole-2-thiol; tritolyl phosphate; indiazole; adenine; salicylamide; iminodiacetic acid; benzoguanamine; thiocyranuric acid; anthranilic acid; 3-mercaptopropanol; and combinations thereof, and wherein the oxirane species comprises a species selected from the group consisting of: oxirane, methyl-, polymer with oxirane, ether with 2,2'-(oxidoimino)bis(ethanol) (2:1), N(-3(C9-11-isoalkyloxy)propyl)derivatives, $C_{10}$-rich; and oxirane, methyl-, polymer with oxirane, mono(octylphenyl)ether.

2. The cleaning composition of claim 1, which is devoid of hydroxylamine therein.

3. The cleaning composition of claim 1, comprising the following components:
0.1-40.0 weight % organic quaternary base;
0.01-5 weight % alkali or alkaline earth base;
0-80 weight % solvent(s) and/or amine(s);
0-5 weight % surfactant;
0-10 weight % chelator/passivation agent; and
0-98 weight % water,
wherein percentages of the components are percentages by weight, based on total weight of the composition, and wherein the total of the weight percentages of such components of the composition does not exceed 100 weight %.

4. The cleaning composition of claim 1, including at least one additional ingredient selected from the group consisting of stabilizers, dispersants, anti-oxidants, fillers, penetration agents, adjuvants, additives, and excipients.

5. The cleaning composition of claim 1, comprising the following components:
2-15 weight % organic quaternary base;
~0.01-2 weight % alkali or alkaline earth base;
0-50 weight % solvent(s) and/or amine(s);
~0.01-2 weight % surfactant;
0-5 weight % chelator/passivation agent; and
40-95 weight % water,
wherein percentages of the components are percentages by weight, based on total weight of the composition, and wherein the total of the weight percentages of such components of the composition does not exceed 100 weight %.

6. The cleaning composition of claim 1, selected from the group consisting of Formulations A-C$^2$, wherein all percentages are by weight, based on the total weight of the formulation:

| Formulation A | |
|---|---|
| 5.36% | benzyltrimethylammonium hydroxide |
| 0.28% | potassium hydroxide |
| 3.0% | 4-methylmorpholine N-oxide |
| 0.30% | polyoxyethylene (150) dinonylphenyl ether |
| 0.08% | 2-mercaptobenzimidazole |
| 91.0% | water |

| Formulation B | |
|---|---|
| 5.36% | benzyltrimethylammonium hydroxide |
| 0.28% | potassium hydroxide |
| 3.0% | 4-methylmorpholine N-oxide |
| 0.30% | polyoxyethylene (150) dinonylphenyl ether |
| 0.20% | 5-amino-1,3,4-thiadiazole-2-thiol |
| 90.86% | water |

| Formulation C | |
|---|---|
| 3.60% | benzyltrimethylammonium hydroxide |
| 0.27% | potassium hydroxide |
| 3.5% | 4-methylmorpholine N-oxide |
| 15.0% | 4-(3-aminopropyl)morpholine |
| 0.30% | polyoxyethylene (150) dinonylphenyl ether |
| 0.08% | 2-mercaptobenzimidazole |
| 77.25% | water |

| Formulation D | |
|---|---|
| 5.36% | benzyltrimethylammonium hydroxide |
| 0.28% | potassium hydroxide |
| 20.0% | dimethyl sulfoxide |
| 0.08% | 2-mercaptobenzimidazole |
| 74.28% | water |

| Formulation E | |
|---|---|
| 5.36% | benzyltrimethylammonium hydroxide |
| 0.28% | potassium hydroxide |
| 10.0% | tetramethylene sulfone |
| 0.30% | oxirane, methyl-, polymer with oxirane, ether with 2,2'-(oxidoimino)bis(ethanol) (2:1), N(-3(C9-11-isoalkyloxy)propyl) derivatives, C$_{10}$-rich |
| 0.08% | 2-mercaptobenzimidazole |
| 83.98% | water |

| Formulation F | |
|---|---|
| 5.36% | benzyltrimethylammonium hydroxide |
| 0.28% | potassium hydroxide |
| 10.0% | di(ethyleneglycol)butyl ether |
| 10.0% | 2-(2-dimethylamino)ethoxy)ethanol |
| 0.30% | oxirane, methyl-, polymer with oxirane, ether with 2,2'-(oxidoimino)bis(ethanol) (2:1), N(-3(C9-11-isoalkyloxy)propyl) derivatives, C$_{10}$-rich |
| 74.06% | water |

| Formulation G | |
|---|---|
| 5.36% | benzyltrimethylammonium hydroxide |
| 0.28% | potassium hydroxide |
| 10.0% | tetramethylene sulfone |
| 10.0% | di(ethyleneglycol)butyl ether |
| 0.10% | oxirane, methyl-, polymer with oxirane, mono(octylphenyl)ether |
| 0.08% | 2-mercaptobenzimidazole |
| 74.18% | water, |

| Formulation H | |
|---|---|
| benzyltrimethylammonium hydroxide, 40% aqueous solution | 9.0% |
| potassium hydroxide, 45% aqueous solution | 0.6% |
| N-methylmorpholine oxide, 50% aqueous solution | 7.0% |
| dinonylphenol ethoxylate, 7% aqueous solution | 4.3% |
| 2-mercaptobenzimidazole | 0.1% |
| aminopropylmorpholine | 20.0% |
| water | 59.02% |

| Formulation I | |
|---|---|
| benzyltrimethylammonium hydroxide, 40% aqueous solution | 9.0% |
| potassium hydroxide, 45% aqueous solution | 0.6% |
| N-methylmorpholine oxide, 50% aqueous solution | 7.0% |
| dinonylphenol ethoxylate, 7% aqueous solution | 4.3% |
| 2-mercaptobenzimidazole | 0.1% |
| aminopropylmorpholine | 15.0% |
| water | 64.02% |

| Formulation J | |
|---|---|
| benzyltrimethylammonium hydroxide, 40% aqueous solution | 9.0% |
| potassium hydroxide, 45% aqueous solution | 0.6% |
| N-methylmorpholine oxide, 50% aqueous solution | 7.0% |
| dinonylphenol ethoxylate, 7% aqueous solution | 4.3% |
| 2-mercaptobenzimidazole | 0.1% |
| aminopropylmorpholine | 10.0% |
| water | 69.02% |

| Formulation K | |
|---|---|
| benzyltrimethylammonium hydroxide, 40% aqueous solution | 13.4% |
| N-methylmorpholine oxide, 50% aqueous solution | 7.0% |
| KOH, 45% aqueous solution | 0.6% |
| 2-mercaptobenzimidizole | 0.08% |
| dinonylphenol polyoxyethylene | 0.3% |
| water | 78.62% |

| Formulation L | |
|---|---|
| benzyltrimethylammonium hydroxide, 40% aqueous solution | 13.4% |
| N-methylmorpholine oxide, 50% aqueous solution | 7.0% |
| KOH, 45% aqueous solution | 1.2% |
| 2-mercaptobenzimidizole | 0.08% |
| dinonylphenol polyoxyethylene | 0.3% |
| water | 78.02% |

| Formulation M | |
|---|---|
| tetramethylammonium hydroxide, 25% aqueous solution | 5.85% |
| N-methylmorpholine oxide, 50% aqueous solution | 7.0% |
| KOH, 45% aqueous solution | 1.2% |
| 2-mercaptobenzimidizole | 0.08% |
| dinonylphenol polyoxyethylene | 0.3% |
| water | 85.57% |

| Formulation N | |
|---|---|
| tetramethylammonium hydroxide, 25% aqueous solution | 2.93% |
| N-methylmorpholine oxide, 50% aqueous solution | 7.0% |
| KOH, 45% aqueous solution | 1.2% |
| 2-mercaptobenzimidizole | 0.08% |
| dinonylphenol polyoxyethylene | 0.3% |
| water | 88.49% |

| Formulation O | |
|---|---|
| benzyltrimethylammonium hydroxide, 40% aqueous solution | 7.2% |
| N-methylmorpholine oxide, 50% aqueous solution | 7.0% |
| KOH, 45% aqueous solution | 0.6% |
| 2-mercaptobenzimidizole | 0.08% |
| dinonylphenol polyoxyethylene | 0.3% |
| water | 84.82% |

| Formulation P | |
|---|---|
| benzyltrimethylammonium hydroxide, 40% aqueous solution | 3.6% |
| N-methylmorpholine oxide, 50% aqueous solution | 7.0% |
| KOH, 45% aqueous solution | 1.2% |
| 2-mercaptobenzimidizole | 0.08% |
| dinonylphenol polyoxyethylene | 0.3% |
| water | 87.82% |

| Formulation Q | |
|---|---|
| benzyltrimethylammonium hydroxide, 40% aqueous solution | 3.6% |
| N-methylmorpholine oxide, 50% aqueous solution | 7.0% |
| KOH, 45% aqueous solution | 0.6% |
| 2-mercaptobenzimidizole | 0.08% |
| dinonylphenol polyoxyethylene | 0.3% |
| water | 88.42% |

| Formulation R | |
|---|---|
| benzyltrimethylammonium hydroxide, 40% aqueous solution | 7.2% |
| N-methylmorpholine oxide, 50% aqueous solution | 7.0% |
| KOH, 45% aqueous solution | 0.3% |
| 2-mercaptobenzimidizole | 0.08% |
| dinonylphenol polyoxyethylene | 0.3% |
| water | 85.12%, |

| Formulation S | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 3-amino-5-mercapto-1,2,4-triazole | 1.0% |
| water | 72.04% |

| Formulation T | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 4-methyl-2-phenyl-imidazole | 1.0% |
| water | 72.04% |

| Formulation U | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 2-mercaptothiazoline | 1.0% |
| water | 72.04% |

| Formulation V | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 8-hydroxyquinoline | 1.0% |
| water | 72.04% |

| Formulation W | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| 1-phenyl-2-tetrazoline-5-thione | 1.0% |
| water | 72.04% |

| Formulation X | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| gallic acid | 1.0% |
| water | 72.04% |

| Formulation Y | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| salicylic acid | 1.0% |
| water | 72.04% |

| Formulation Z | |
|---|---|
| benzyltrimethylammonium hydroxide, 40% aqueous solution | 22.26% |
| Potassium hydroxide, 45% aqueous solution | 0.6% |
| 2-mercaptobenzimidazole | 0.08% |
| methyldiethanolamine | 2.33% |
| phosphoric acid (86%) | 1.69% |
| ascorbic acid | 1.0% |
| water | 72.04% |

| Formulation $A^2$ | |
|---|---|
| benzyltrimethylammonium hydroxide, 40% aqueous solution | 7.2% |
| Potassium hydroxide, 45% aqueous solution | 0.6% |
| 2-mercaptobenzimidazole | 0.08% |
| aminopropyl morpholine | 10% |
| 4-methyl-2-phenyl-imidazole | 1.0% |
| water | 81.12% |

| Formulation $B^2$ | |
|---|---|
| benzyltrimethylammonium hydroxide, 40% aqueous solution | 7.2% |
| Potassium hydroxide, 45% aqueous solution | 0.6% |
| 2-mercaptobenzimidazole | 0.08% |
| aminopropyl morpholine | 10% |
| 4-methyl-2-phenyl-imidazole | 0.5% |
| water | 81.62% |

| Formulation $C^2$ | |
|---|---|
| benzyltrimethylammonium hydroxide, 40% aqueous solution | 7.2% |
| Potassium hydroxide, 45% aqueous solution | 0.6% |
| 2-mercaptobenzimidazole | 0.08% |
| aminopropyl morpholine | 10% |
| 4-methyl-2-phenyl-imidazole | 1.0% |
| water | 81.02% |
| dinonylphenol polyoxyethylene | 0.1%. |

7. The cleaning composition of claim 1, wherein the alkali base comprises potassium hydroxide.

8. The cleaning composition of claim 1, wherein the chelator comprises 2-mercaptobenzimidazole.

9. The cleaning composition of claim 1, wherein the chelator is present in an amount greater than about 0.08 wt. %, based on the total weight of the composition.

10. The composition of claim 1, further comprising a surfactant.

11. The composition of claim 10, wherein the surfactant comprises a surfactant species selected from the group consisting of: fluoroalkyl surfactants; polyethylene glycols; polypropylene glycols; polyethylene glycol ethers; polypropylene glycol ethers; carboxylic acid salts; dodecylbenzenesulfonic acid and salts thereof; polyacrylate polymers; dinonylphenyl polyoxyethylene; silicone polymers; modified silicone polymers; acetylenic diols; modified acetylenic diols, alkylammonium salts; modified alkylammonium salts; and combinations of two or more of the foregoing.

12. The composition of claim 1, further comprising a co-solvent.

13. The composition of claim 12, wherein the co-solvent comprises a co-solvent species selected from the group consisting of: amines; glycols; glycol ethers; polyglycol ethers; and combinations of two or more of the foregoing.

14. The composition of claim 12, wherein the co-solvent comprises a co-solvent species selected from the group consisting of: dimethyldiglycolamine; 1,8-diazabicyclo[5.4.0] undecene; aminopropylmorpholine; triethanolamine; methylethanolamine; diethylene glycol; propylene glycol; neopentyl glycol; hydroxyethylmorpholine; aminopropylmorpholine; di(ethylene glycol)monoethyl ether; di(propylene glycol)propyl ether; ethylene glycol phenyl ether; di(propylene glycol) butyl ether; butyl carbitol; polyglycol ethers; and combinations of two or more of the foregoing.

15. A method of removing photoresist and/or SARC material from a substrate having said material thereon, said method comprising contacting the substrate with a cleaning composition for sufficient time to at least partially remove said material from the substrate, wherein the cleaning composition comprises a quaternary base, at least one alkali or alkaline earth base, and at least one additional component selected from the group consisting of a chelator, an oxirane species, and combinations thereof, wherein said chelator comprises a species selected from the group consisting of:

1-amino-1,2,4-triazole; 1-amino-1,2,3-triazole; 1-amino-5-methyl-1,2,3-triazole; 3-mercapto-1,2,4-triazole; 3-isopropyl-1,2,4-triazole; naphthotriazole; 2-mercaptobenzimidazole; 5-aminotetrazole; 5-amino-1,3,4-thiadiazole-2-thiol; 2,4-diamino-6-methyl-1,3,5-triazine; triazine; methyltetrazole; 1,5-pentamethylenetetrazole; 1-phenyl-5-mercaptotetrazole; diaminomethyltriazine; imidazoline thione; 4-methyl-4H-1,2,4-triazole-3-thiol; 5-amino-1,3,4-thiadiazole-2-thiol; tritolyl phosphate; indiazole; adenine; salicylamide; iminodiacetic acid; benzoguanamine; thiocyranuric acid; anthranilic acid; 3-mercaptopropanol; and combinations thereof, and wherein the oxirane species comprises a species selected from the group consisting of: oxirane, methyl-, polymer with oxirane, ether with 2,2'-(oxidoimino)bis(ethanol) (2:1), N(-3(C9-11-isoalkyloxy)propyl)derivatives, $C_{10}$-rich; and oxirane, methyl-, polymer with oxirane, mono(octylphenyl)ether.

16. The method of claim 15, wherein the substrate comprises a semiconductor device structure.

17. The method of claim 15, wherein the material comprises photoresist.

18. The method of claim 15, wherein the material comprises SARC material.

19. The method of claim 18, wherein the SARC material has been applied to a semiconductor device structure to minimize reflectivity variations during photolithographic patterning on the semiconductor device structure.

20. The method of claim 15, wherein said contacting is carried out for a time of from about 10 to about 45 minutes.

21. The method of claim 15, wherein said contacting is carried out at temperature in a range of from about 50° C. to about 80° C.

22. The method of claim 15, wherein the composition is devoid of hydroxylamine therein.

23. The method of claim 15, wherein the composition comprises the following components:
 0.1-40.0 weight % organic quaternary base;
 0.01-5 weight % alkali or alkaline earth base;
 0-80 weight % solvent(s) and/or amine(s);
 0-5 weight % surfactant;
 0-10 weight % chelator/passivation agent; and
 0-98 weight % water,
wherein percentages of the components are percentages by weight, based on total weight of the composition, and wherein the total of the weight percentages of such components of the composition does not exceed 100 weight %.

24. The method of claim 15, wherein the composition includes at least one additional ingredient selected from the group consisting of stabilizers, dispersants, anti-oxidants, fillers, penetration agents, adjuvants, additives, fillers, and excipients.

25. The method of claim 15, wherein the composition comprises the following components:
 2-15 weight % organic quaternary base;
 ~0.01-2 weight % alkali or alkaline earth base;
 0-50 weight % solvent(s) and/or amine(s);
 ~0.01-2 weight % surfactant;
 0-5 weight % chelator/passivation agent; and
 40-95 weight % water,
wherein percentages of the components are percentages by weight, based on total weight of the composition, and wherein the total of the weight percentages of such components of the composition does not exceed 100 weight %.

26. The method of claim 15, wherein the alkali base comprises potassium hydroxide.

27. The method of claim 15, wherein the chelator comprises 2-mercaptobenzimidazole.

28. The method of claim 27, wherein the chelator is present in an amount greater than about 0.08 wt. %, based on the total weight of the composition.

29. The method of claim 15, wherein the quaternary base comprises benzyltrimethylammonium hydroxide.

30. The method of claim 15, wherein the cleaning composition further comprises a surfactant.

31. The method of claim 30, wherein the surfactant comprises a surfactant species selected from the group consisting of: fluoroalkyl surfactants; polyethylene glycols; polypropylene glycols; polyethylene glycol ethers; polypropylene glycol ethers; carboxylic acid salts; dodecylbenzenesulfonic acid and salts thereof; polyacrylate polymers; dinonylphenyl polyoxyethylene; silicone polymers; modified silicone polymers; acetylenic diols; modified acetylenic diols, alkylammonium salts; modified alkylammonium salts; and combinations of two or more of the foregoing.

32. The method of claim 15, wherein the cleaning composition further comprises a co-solvent.

33. The method of claim 32, wherein the co-solvent comprises a co-solvent species selected from the group consisting of: amines; glycols; glycol ethers; polyglycol ethers; and combinations of two or more of the foregoing.

34. The method of claim 32, wherein the co-solvent comprises a co-solvent species selected from the group consisting of: dimethyldiglycolamine; 1,8-diazabicyclo[5.4.0]undecene; aminopropylmorpholine; triethanolamine; methylethanolamine; diethylene glycol; propylene glycol; neopentyl glycol; hydroxyethylmorpholine; aminopropylmorpholine; di(ethylene glycol)monoethyl ether; di(propylene glycol)propyl ether; ethylene glycol phenyl ether; di(propylene glycol) butyl ether; butyl carbitol; polyglycol ethers; and combinations of two or more of the foregoing.

35. The cleaning composition of claim 1, wherein the quaternary base comprises an organic quaternary ammonium base.

36. The cleaning composition of claim 1, wherein the quaternary base comprises benzyltrimethylammonium hydroxide.

37. The cleaning composition of claim 1, wherein the cleaning composition comprises benzyltrimethylammonium hydroxide and potassium hydroxide.

38. The cleaning composition of claim 12, wherein the co-solvent comprises a glycol ether.

39. The cleaning composition of claim 1 comprising benzyltrimethylammonium hydroxide; potassium hydroxide; tetramethylene sulfone; di(ethyleneglycol)butyl ether; oxirane, methyl-, polymer with oxirane, mono(octylphenyl) ether; 2-mercaptobenzimidazole; and water.

40. A method of making a semiconductor device comprising contacting the substrate with the cleaning composition of claim 1 for sufficient time to at least partially remove said material from the substrate.

41. The cleaning composition of claim 1, further comprising oxidant.

* * * * *